(12) United States Patent
Yoo et al.

(10) Patent No.: US 12,484,344 B2
(45) Date of Patent: Nov. 25, 2025

(54) DISPLAY DEVICE AND METHOD OF MANUFACTURING THE SAME

(71) Applicant: Samsung Display Co., LTD., Yongin-si (KR)

(72) Inventors: Je Won Yoo, Yongin-si (KR); Min Joo Kim, Yongin-si (KR); Sung Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 812 days.

(21) Appl. No.: 17/590,070

(22) Filed: Feb. 1, 2022

(65) Prior Publication Data
US 2022/0406970 A1 Dec. 22, 2022

(30) Foreign Application Priority Data
Jun. 17, 2021 (KR) .................. 10-2021-0079007

(51) Int. Cl.
*H10H 20/831* (2025.01)
*H10H 20/01* (2025.01)
*H10H 20/857* (2025.01)

(52) U.S. Cl.
CPC ........ *H10H 20/8312* (2025.01); *H10H 20/01* (2025.01); *H10H 20/857* (2025.01); *H10H 20/032* (2025.01); *H10H 20/0364* (2025.01)

(58) Field of Classification Search
CPC .. H10H 20/8312; H10H 20/01; H10H 20/857; H10H 20/0364; H10H 20/831; H10H 29/8321; H10H 29/49; H10H 29/857; H10H 29/922; H10H 29/942; H10H 20/011; H10H 20/016; H10H 20/0165; H10H 20/017; H10H 20/021; H10H 20/032; H10H 20/034; H10H 20/036; H10H 20/0362; H10H 20/0363; H10H 29/01; H10H 29/011; H10H 29/012; H10H 29/02; H10H 29/03; H10H 29/032; H10H 29/034; H10H 29/036; H10H 29/0361; H10H 29/0362; H10H 29/0363; H10H 29/0364; H10H 29/0365; H10D 30/0295;
(Continued)

(56) References Cited

U.S. PATENT DOCUMENTS 8,168,940 B2 5/2012 Tanaka et al.
10,497,680 B2 12/2019 Sung et al.
10,658,605 B2 5/2020 Lee et al.
(Continued)

FOREIGN PATENT DOCUMENTS

KR 10-2010-0041819 4/2010
KR 10-1874993 7/2018
(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display device includes a light emitting element disposed on a substrate, and including a first end and a second end; a first contact electrode electrically connected to the second end of the light emitting element; a second contact electrode electrically connected to the first end of the light emitting element; and a liquid metal part electrically connecting the first end of the light emitting element to the second contact electrode.

20 Claims, 13 Drawing Sheets

(58) Field of Classification Search
CPC ............. H10D 30/0217; H10D 84/858; H01L 25/0753; A23B 2/40
See application file for complete search history.

(56) References Cited

U.S. PATENT DOCUMENTS

| | | | |
|---|---|---|---|
| 11,387,396 | B2 | 7/2022 | Rhee |
| 12,068,356 | B2 | 8/2024 | Li et al. |
| 12,224,384 | B2 | 2/2025 | An et al. |
| 2013/0062632 | A1* | 3/2013 | Lee .................. H10H 20/8506 257/E33.056 |
| 2015/0340578 | A1* | 11/2015 | Tamaki ................. H01L 24/97 257/99 |
| 2017/0256520 | A1* | 9/2017 | Moon .................. H10H 20/857 |
| 2019/0296202 | A1* | 9/2019 | Chen ...................... H01L 24/20 |
| 2020/0028115 | A1* | 1/2020 | Yang ................... H10K 59/873 |
| 2020/0176656 | A1* | 6/2020 | Bae ........................ H10H 20/01 |
| 2020/0219839 | A1 | 7/2020 | Wu et al. |
| 2020/0357955 | A1* | 11/2020 | Chuang .............. H10H 20/8314 |
| 2021/0223629 | A1* | 7/2021 | Tsuzuki ................. C09J 7/381 |
| 2021/0234077 | A1* | 7/2021 | Toyama .............. H10H 20/853 |
| 2021/0351156 | A1* | 11/2021 | Wendt .................... H01L 24/13 |
| 2022/0102604 | A1 | 3/2022 | Do et al. |

FOREIGN PATENT DOCUMENTS

| | | |
|---|---|---|
| KR | 10-2019-0010409 | 1/2019 |
| KR | 10-2019-0029831 | 3/2019 |
| KR | 10-2048994 | 11/2019 |
| KR | 10-2020-0041429 | 4/2020 |
| KR | 10-2020-0088946 | 7/2020 |
| KR | 10-2020-0145951 | 12/2020 |

* cited by examiner

DISPLAY DEVICE AND METHOD OF MANUFACTURING THE SAME

CROSS-REFERENCE TO RELATED APPLICATION(S)

This application claims priority to and benefits of Korean patent application number 10-2021-0079007 under 35 U.S.C. § 119, filed in the Korean Intellectual Property Office on Jun. 17, 2021, the entire contents of which are incorporated herein by reference.

BACKGROUND

1. Technical Field

Various embodiments of the disclosure relate to a display device and a method of fabricating the display device, and more specifically, to a display device and a method of manufacturing the display device, which is capable of preventing an electrical contact failure of a light emitting element and improving reliability of an electrical signal transmission and light emission efficiency.

2. Description of Related Art

The importance of display devices as communication media, has been emphasized because of the increasing developments of information technology.

SUMMARY

Various embodiments of the disclosure are directed to a display device and a method of manufacturing the display device, which is capable of preventing an electrical contact failure of a light emitting element and improving reliability of an electrical signal transmission and emission efficiency.

The disclosure is not limited to the above-described objects, and other objects that are not mentioned will be clearly understood by those skilled in the art from the following description.

An embodiment of the disclosure may provide a display device including a light emitting element disposed on a substrate and including a first end and a second end, a first contact electrode electrically connected to the second end of the light emitting element, a second contact electrode electrically connected to the first end of the light emitting element, and a liquid metal part electrically connecting the first end of the light emitting element to the second contact electrode.

In an embodiment, a portion of the liquid metal part may electrically contact the light emitting element, and another portion of the liquid metal part may electrically contact the second contact electrode.

In an embodiment, an oxide film may be formed on a surface of the liquid metal part.

In an embodiment, the display device may further include a first electrode and a second electrode disposed on the substrate and spaced apart from each other in a first direction. The light emitting element may be disposed between the first electrode and the second electrode. The liquid metal part may extend in a second direction intersecting the first direction.

In an embodiment, the light emitting element may include a first light emitting element, and a second light emitting element adjacent to the first light emitting element in the second direction. The liquid metal part may electrically contact each of the first light emitting element and the second light emitting element.

In an embodiment, the light emitting element may include a first semiconductor layer adjacent to the first end of the light emitting element and including an N-type semiconductor layer, and a second semiconductor layer adjacent to the second end and including a P-type semiconductor layer. A distance between the liquid metal part and the first semiconductor layer may be smaller than a distance between the liquid crystal part and the second semiconductor layer.

In an embodiment, the light emitting element may have an uneven surface on the first end of the light emitting element.

In an embodiment, the light emitting element may include a concave portion and a convex portion, and the concave portion and the convex portion may be disposed in the first end of the light emitting element and may electrically contact the liquid metal part.

In an embodiment, the light emitting element may include an inclined area adjacent to the first end of the light emitting element. The light emitting element may have a surface nonparallel to a thickness-wise direction of the substrate in the inclined area.

In an embodiment, the light emitting element may electrically contact the liquid metal part in the inclined area.

In an embodiment, the liquid metal part may overlap the light emitting element in the inclined area in a plan view.

In an embodiment, at least a portion of the liquid metal part may be disposed under the light emitting element in the inclined area.

In an embodiment, the liquid metal part may include an eutectic gallium-indium (EGaIn) alloy or a gallium-indium-tin (Galinstan) alloy.

In an embodiment, the light emitting element may be supplied with an anode signal through the first contact electrode and supplied with a cathode signal through the second contact electrode and the liquid metal part.

In an embodiment, the display device may further include a second insulating layer disposed on the light emitting element, and located between the first contact electrode and the liquid metal part in a plan view.

An embodiment of the disclosure may provide a method of manufacturing a display device, including forming a first electrode and a second electrode on a substrate, forming a first insulating layer on the first electrode and the second electrode, arranging a light emitting element including a first end and a second end on the first insulating layer, providing a liquid metal part adjacent to the first end of the light emitting element, and forming a first contact electrode electrically connecting the first electrode to the light emitting element and a second contact electrode electrically connecting the second electrode to the light emitting element. The liquid metal part may electrically connect the light emitting element to the second contact electrode.

In an embodiment, the providing of the liquid metal part may be performed by a method using a printing device that discharges the liquid metal part or an electrospinning method.

In an embodiment, the method may further include after the providing of the liquid metal part, forming a base insulating layer overlapping at least a portion of the light emitting element in a plan view. The forming of the base insulating layer may include exposing the first end of the light emitting element.

In an embodiment, the base insulating layer may overlap the light emitting element such that a flow of the liquid metal part is blocked in a plan view.

In an embodiment, the providing of the liquid metal part may include electrically contacting the first end of the light emitting element to the liquid metal part.

The technical solutions of the disclosure may not be limited to the above, and other technical solutions of the disclosure will be clearly understandable to those having ordinary skill in the art from the disclosures provided below together with accompanying drawings.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
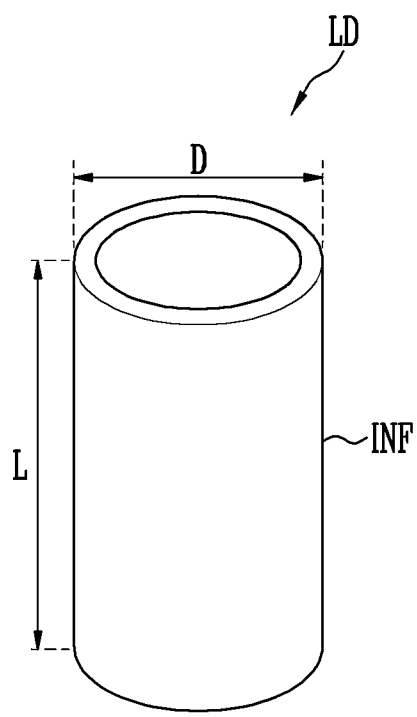
FIG. 1 is a perspective view schematically illustrating a light emitting element in accordance with an embodiment.

Embodiments of the invention will be described hereinafter with reference to the accompanying drawings. Although the embodiments may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the disclosure.

Some of the parts which are not associated with the description may not be provided in order to describe embodiments of the invention and like reference numerals refer to like elements throughout the specification.

The terms used in this specification are selected from general terms, which are widely used currently, based on functions of components according to the embodiment of the disclosure, and may have meanings varying according to the intentions of those skilled in the art, the custom in the field of art, or advent of new technology. If a specific term is used with a specific meaning, the meaning of the term will be described specifically. Accordingly, the terms used in this specification should not be defined as simple names of the components, but be defined based on the actual meaning of the terms and the whole context throughout the specification.

In the drawings, sizes and thicknesses of the elements may be enlarged or exaggerated for clarity and ease of description thereof. However, the disclosure should not be limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the specification and the claims, the term "and/or" is intended to include any combination of the terms "and" and "or" for the purpose of its meaning and interpretation. For example, "A and/or B" may be understood to mean "A, B, or A and B". The terms "and" and "or" may be used in the conjunctive or disjunctive sense and may be understood to be equivalent to "and/or".

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B".

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
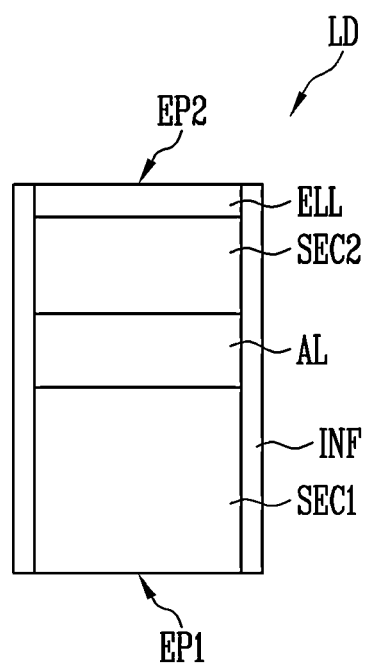
FIG. 2 is a cross-sectional view illustrating the light emitting element of FIG. 1.

FIGS. 1 and 2 illustrate a light emitting element LD included in a display device in accordance with an embodiment. FIG. 1 is a perspective view illustrating the light emitting element LD in accordance with the embodiment. FIG. 2 is a cross-sectional view illustrating the light emitting element of FIG. 1.

Referring to FIGS. 1 and 2, the light emitting element LD may include a first semiconductor layer SEC1, a second semiconductor layer SEC2, and an active layer AL. The active layer AL may be interposed between the first semiconductor layer SEC1 and the second semiconductor layer SEC2. The light emitting element LD may further include an electrode layer ELL. In an embodiment, the first semiconductor layer SEC1, the active layer AL, the second semiconductor layer SEC2, and the electrode layer ELL may be sequentially stacked in a longitudinal direction (L) of the light emitting element LD.

The light emitting element LD may include a first end EP1 and a second end EP2. The first semiconductor layer SEC1 may be adjacent to the first end EP1 of the light emitting element LD. The second semiconductor layer SEC2 and the electrode layer ELL may be adjacent to the second end EP2 of the light emitting element LD.

In an embodiment, the light emitting element LD may have a pillar shape, which extends in the longitudinal direction. The pillar shape may include a cylindrical shape, a prismatic shape, or other suitable extended shapes. The length L of the light emitting element LD may be greater than a diameter D thereof (or a width of the cross-section thereof). The cross-section of the light emitting element LD may have a rod shape, a bar shape, or other suitable stretched shapes. However, the embodiments are not limited thereto, and the cross-section of the light emitting element LD may have various shapes.

The light emitting element LD may have a size of a nanometer scale (equal to or greater than 1 nm and less than 1 μm) to a micrometer scale (equal to or greater than 1 μm and less than 1 mm). For example, the diameter D (or the width) and the length L of the light emitting element LD each may have a size ranging from the nanometer scale to the micrometer scale. However, the embodiments are not limited thereto, and the light emitting element LD may have various sizes.

The first semiconductor layer SEC1 may be a first conductive semiconductor layer. For example, the first semiconductor layer SEC1 may include an N-type semiconductor layer. For example, the N-type semiconductor layer of the first semiconductor layer SEC1 may include at least one semiconductor material of InAlGaN, GaN, AlGaN, InGaN, AlN, InN, and a combination thereof, and may be doped with a first conductive dopant such as Si, Ge, or Sn. However, the embodiments are not limited thereto, and the first semiconductor layer SEC1 may be formed of various materials.

The active layer AL may be disposed on the first semiconductor layer SEC1. The active layer AL may be disposed between the first semiconductor layer SEC1 and the second semiconductor layer SEC2.

The active layer AL may include at least one of AlGaInP, AlGaP, AlInGaN, InGaN, and AlGaN. For example, the active layer AL may emit red light, and the active layer AL may include AlGaInP and/or InGaN. In case that the active layer AL emits green light or blue light, the active layer AL may include InGaN. However, the embodiments are not limited thereto, and the active layer AL may include various materials.

The active layer AL may have a single-quantum well structure or a multi-quantum well structure.

The second semiconductor layer SEC2 may be disposed on the active layer AL and include a semiconductor layer having a type different from that of the first semiconductor layer SEC1. For example, the second semiconductor layer SEC2 may include a P-type semiconductor layer. For example, the P-type semiconductor layer of the second semiconductor layer SEC2 may include at least one semiconductor material of InAlGaN, GaN, AlGaN, InGaN, AlN, InN, and a combination thereof, and may be doped with a second conductive dopant such as Mg. However, the embodiments are limited thereto, and the second semiconductor layer SEC2 may be formed of various materials.

The electrode layer ELL may be formed on the second semiconductor layer SEC2. The electrode layer ELL may include metal or metal oxide. For example, the electrode layer ELL may include at least one of Cr, Ti, Al, Au, Ni, ITO, IZO, ITZO, an oxide thereof, and an alloy thereof.

In an embodiment, the light emitting element LD may have an uneven surface on the first end EP1. Detailed description of the first end EP1 is provided below with reference to FIGS. 6 and 7.

In case that a voltage equal to or greater than a threshold voltage is applied between the first and second ends EP1 and EP2 of the light emitting element LD, the light emitting element LD may emit light by coupling of electron-hole pairs in the active layer AL. The light emission of the light emitting element LD may be controlled by the application of the voltage, and the light emitting element LD may be used as a light source of various light emitting devices or a pixel of the display device DD (refer to FIG. 3).

The light emitting element LD may further include an insulating film INF provided on a surface of the light emitting element LD. The insulating film INF may be formed of a single layer or multiple layers.

The insulating film INF may expose the opposite ends (e.g., first and second ends EP1 and EP2) of the light emitting element LD. The opposite ends may have different polarities to be exposed to the outside. For example, the insulating film INF may expose a portion of the first semiconductor layer SEC1 disposed adjacent to the first end EP1 and a portion of the electrode layer ELL disposed adjacent to the second end EP2 to be exposed to the outside.

The insulating film INF may include at least one insulating material selected from the group of silicon oxide ($SiO_x$), silicon nitride ($SiN_x$), silicon oxynitride ($SiO_xN_y$), aluminum oxide ($AlO_x$), and titanium dioxide ($TiO_x$). The embodiments are not limited thereto a specific example.

The insulating film INF may secure electrical stability of the light emitting element LD. In addition, in case that light emitting elements LD are disposed adjacent to each other, an undesired short-circuit may be prevented from occurring between the light emitting elements LD.

In an embodiment, the light emitting element LD may further include other components as well as the first semiconductor layer SEC1, the active layer AL, the second semiconductor layer SEC2, the electrode layer ELL, and the insulating film INF. For example, the light emitting element LD may further include a fluorescent layer, an active layer, a semiconductor layer, and/or an electrode layer.

Figure 3:
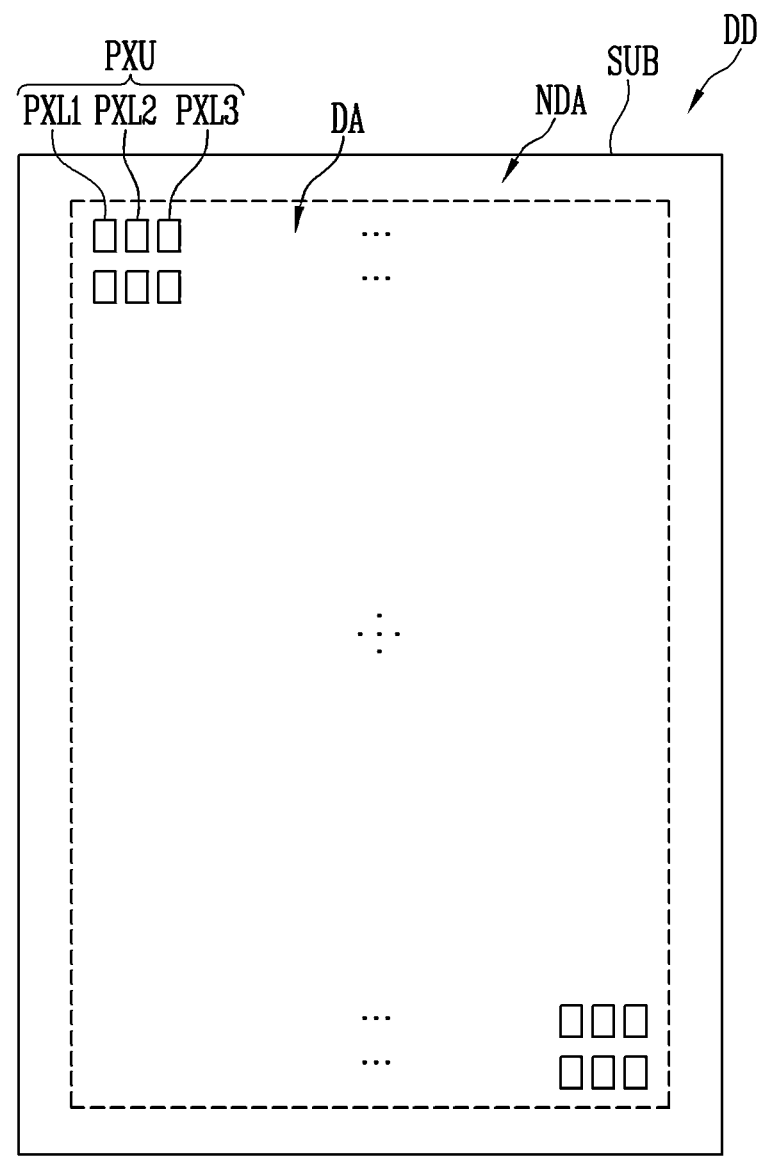
FIG. 3 is a plan view schematically illustrating the display device in accordance with an embodiment.

FIG. 3 is a plan view schematically illustrating the display device in accordance with an embodiment.

The display device DD may emit light. Referring to FIG. 3, the display device DD may include a substrate SUB, and pixels PXL disposed on the substrate SUB. Although not illustrated in the drawing, the display device DD may further include a driving circuit layer (e.g., a scan driver and a data driver) configured to drive the pixels PXL, lines, and pads.

The display device DD may include a display area DA and a non-display area NDA. For example, the display area DA may be a portion of the display device DD, in which an image is displayed, and the non-display area NDA may refer to an area other than the display area DA. The non-display area NDA may enclose or surround at least a portion of the display area DA. For example, the non-display area NDA may entirely surround the display area DA.

The substrate SUB may form a base of the display device DD. The substrate SUB may be a rigid or flexible substrate or a rigid or flexible film. However, the embodiments are not limited thereto, and the substrate SUB may include various substrates.

The display area DA may refer to an area in which the pixels PXL are disposed. The non-display area NDA may refer to an area in which the pixels PXL are not disposed. The driving circuit layer, the lines, and the pads may be disposed in the non-display area NDA, and may be electrically connected to the pixels PXL of the display area DA.

For example, the pixels PXL may be arranged in a stripe or PENTILE™ arrangement structure or the like. However, the embodiments are not limited thereto. Various known embodiments may be applied to the arrangement structure of the pixels PXL.

In an embodiment, the pixels PXL may include a first pixel PXL1, a second pixel PXL2, and a third pixel PXL3. In the specification and the drawings, the reference character "PXL" may refer to any one of the first to third pixels PXL1, PXL2, and PXL3, and the reference character "PXU" may refer to a combination of the first to third pixels PXL1, PXL2, and PXL3. For example, each of the first to third pixels PXL1, PXL2, and PXL3 may be a sub-pixel. At least one first pixel PXL1, at least one second pixel PXL2, and at least one third pixel PXL3 may form a pixel unit (or pixel part) PXU. Each of the pixel parts PXU may emit light having various colors. For example, lights emitted from the first to third pixels PXL1, PLX2, and PXL3 may be mixed to emit the light having the various colors.

For example, each of the first to third pixels PXL1, PXL2, and PXL3 may emit light of a predetermined color. For example, the first pixel PXL1 may be a red pixel configured to emit red (e.g., first color) light, the second pixel PXL2 may be a green pixel configured to emit green (e.g., second color) light, and the third pixel PXL3 may be a blue pixel configured to emit red (e.g., third color) light. However, the embodiments are not limited thereto, and the color, type, and/or number of first to third pixels PXL1, PXL2, and PXL3 which form each pixel part PXU may be changed.

Hereinafter, a structure of the pixel PXL in accordance with an embodiment is provided below in more detail with reference to FIGS. 4 to 8.

Figure 4:
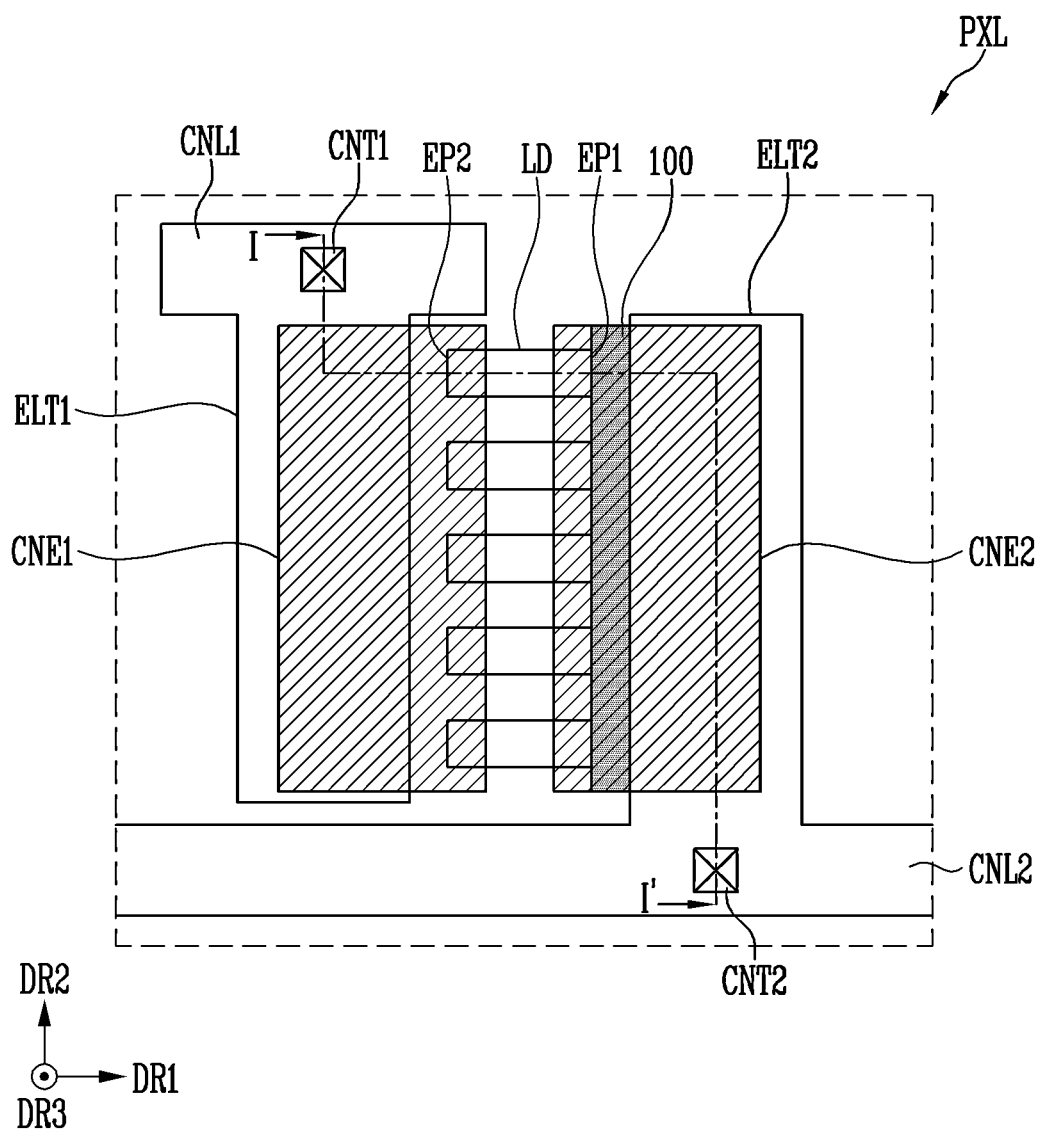
FIG. 4 is a plan view schematically illustrating a pixel in accordance with an embodiment.

FIG. 4 is a plan view illustrating the pixel PXL in accordance with an embodiment. The pixel PXL illustrated in FIG. 4 may be any one of the first to third pixels PXL1, PXL2, and PXL3.

Referring to FIG. 4, the pixel PXL may include a first electrode ELT1, a second electrode ELT2, a first connection line CNL1, a second connection line CNL2, a first contact hole CNT1, a second contact hole CNT2, a light emitting element LD, a liquid metal part 100, a first contact electrode CNE1, and a second contact electrode CNE2.

Multiple light emitting elements LD may be provided and arranged in a parallel with each other. For example, the light emitting elements LD may be arranged in a second direction DR2, and a longitudinal direction of each of the light emitting elements LD may be arranged in a first direction DR1 intersecting the second direction DR2. A third direction DR3 may be a thickness direction of the display device DD (refer to FIG. 3), and may be perpendicular to a plane defined by the first and second directions DR1 and DR3. However, the embodiments are not limited thereto, and the light emitting elements LD may be arranged in various arrangements.

For example, the light emitting elements LD may include a first light emitting element, and a second light emitting element disposed adjacent to the first light emitting element in the second direction DR2. In an embodiment, each of the first light emitting element and the second light emitting element may contact the liquid metal part 100. The first end EP1 of each of the first light emitting element and the second light emitting element may be electrically connected to the liquid metal part 100.

The light emitting elements LD may be disposed between electrodes configured to function as alignment electrodes.

In an embodiment, the light emitting elements LD may be disposed between the first electrode ELT1 and the second electrode ELT2. The light emitting elements LD may be disposed on the first electrode ELT1 and the second electrode ELT2. At least some of the light emitting elements LD may be disposed between the first electrode ELT1 and the second electrode ELT2, in a plan view. For example, side portions (e.g. the first and second ends EP1 and EP2) of the light emitting elements LD may be respectively disposed on the second electrode ELT2 and the first electrode ELT1, and central portions of the light emitting elements LD may be disposed between the first electrode ELT1 and the second electrode ELT2.

The light emitting elements LD may be electrically connected to the first electrode ELT1 through the first contact electrode CNE1.

In an embodiment, the second ends EP2 of the light emitting elements LD may be electrically connected to the first contact electrode CNE1. Hence, the second semiconductor layer SEC2 (e.g., refer to FIG. 2) of each of the light emitting elements LD may be electrically connected to the first electrode ELT1 and the first contact electrode CNE1.

The light emitting elements LD may be electrically connected to the second electrode ELT2 through the second contact electrode CNE2.

In an embodiment, the first ends EP1 of the light emitting elements LD may be electrically connected to the second contact electrode CNE2. Hence, the first semiconductor layer SEC1 (e.g., refer to FIG. 2) of the light emitting elements LD may be electrically connected to the second electrode ELT2 and the second contact electrode CNE2.

Here, the light emitting elements LD may be electrically connected to the second electrode ELT2 and the second contact electrode CNE2 through the liquid metal part 100. For example, the first end EP1 of each of the light emitting elements LD may contact at least a portion of the liquid metal part 100. For example, the first ends EP1 of the light emitting elements LD may be electrically connected to the liquid metal part 100, and may electrically and physically contact the liquid metal part 100. Another portion of the liquid metal part 100 may be electrically connected to the second contact electrode CNE2.

The first electrode ELT1 may extend in the second direction DR2. The first electrode ELT1 may be spaced apart from the second electrode ELT2 in the first direction DR1. The first electrode ELT1 may be electrically connected to the first connection line CNL1. Here, the first direction DR1 may intersect (or be nonparallel with) the second direction DR2. The first connection line CNL1 may be connected to a bridge pattern BRP (refer to FIG. 5) included in a pixel circuit part PCL (refer to FIG. 5) through the first contact hole CNT1.

However, the embodiments are not limited thereto, and the above-mentioned elements may have various connection structures. For example, in an embodiment, the first connection line CNL1 may be electrically connected to a first transistor electrode TE1. In another embodiment, the first connection line CNL1 may be directly connected to the first transistor electrode TE1 rather than being connected to the first transistor electrode TE1 through the bridge pattern BRP.

The second electrode ELT2 may extend in the second direction DR2. The second electrode ELT2 may be spaced apart from the first electrode ELT1 in the first direction DR1. The second electrode ELT2 may be electrically connected to the second connection line CNL2. The second connection line CNL2 may be connected to a power line PL (refer to FIG. 5) included in the pixel circuit part PCL (refer to FIG. 5) through the second contact hole CNT2.

The first contact electrode CNE1 may be disposed on the first electrode ELT1 and electrically connected to the first electrode ELT1.

The second contact electrode CNE2 may be disposed on the second electrode ELT2 and electrically connected to the second electrode ELT2.

In an embodiment, at least a portion of the second contact electrode CNE2 may be disposed on the liquid metal part 100, so that the second contact electrode CNE2 may be electrically connected to the liquid metal part 100. For example, the second contact electrode CNE2 may be in electrical and physical contact with the liquid metal part 100.

For example, at least a portion of the second contact electrode CNE2 may contact (e.g. direct contact) the liquid metal part 100, so that the second contact electrode CNE2 and the liquid metal part 100 may be electrically connected to each other.

The liquid metal part 100 may be disposed adjacent to the first end EP1 of the light emitting element LD. For example, a distance between the liquid metal part 100 and the first semiconductor layer SEC1 of the light emitting element LD may be smaller than a distance between the liquid metal part 100 and to the second semiconductor layer SEC2 of the light emitting element LD.

The liquid metal part 100 may be disposed under the second contact electrode CNE2. In a plan view, the liquid metal part 100 may overlap the second contact electrode CNE2.

In an embodiment, the liquid metal part 100 may extend in the second direction DR2. Thus, the liquid metal part 100 may be electrically connected to the first ends EP1 of the light emitting elements LD that are arranged in parallel.

In an embodiment, in the display device DD, an oxide film 101 (e.g., refer to FIG. 6) may be provided (or formed) on a surface of the liquid metal part 100. Here, the oxide film 101 may refer to a material (or structure) formed by changing (or oxidizing) material included in the liquid metal part 100 into oxide under oxygen environment. In an embodiment, the liquid metal part 100 may be provided in a predetermined shape by the oxide film formed on the surface thereof. For example, liquid crystal may be discharged (or dropped) on the first insulating layer INS1, transported toward the first end EP1, and oxidized to form the liquid metal part 100 and the oxide film 101.

The liquid metal part 100 may have a predetermined conductivity. The liquid metal part 100 may be electrically connected to the first ends EP1 of the light emitting elements LD. The liquid metal part 100 may be electrically connected to the second contact electrode CNE2.

In an embodiment, the liquid metal part 100 may include the liquid metal. In an embodiment, the liquid metal may include an eutectic gallium-indium (EGaIn) alloy or a gallium-indium-tin (Galinstan) alloy. The embodiments are not limited thereto, and the liquid metal may include various conductive materials having fluidity.

Hereinafter, a cross-sectional structure of the pixel PXL in accordance with an embodiment will be mainly described with reference to FIGS. 5 to 6.

Figure 5:
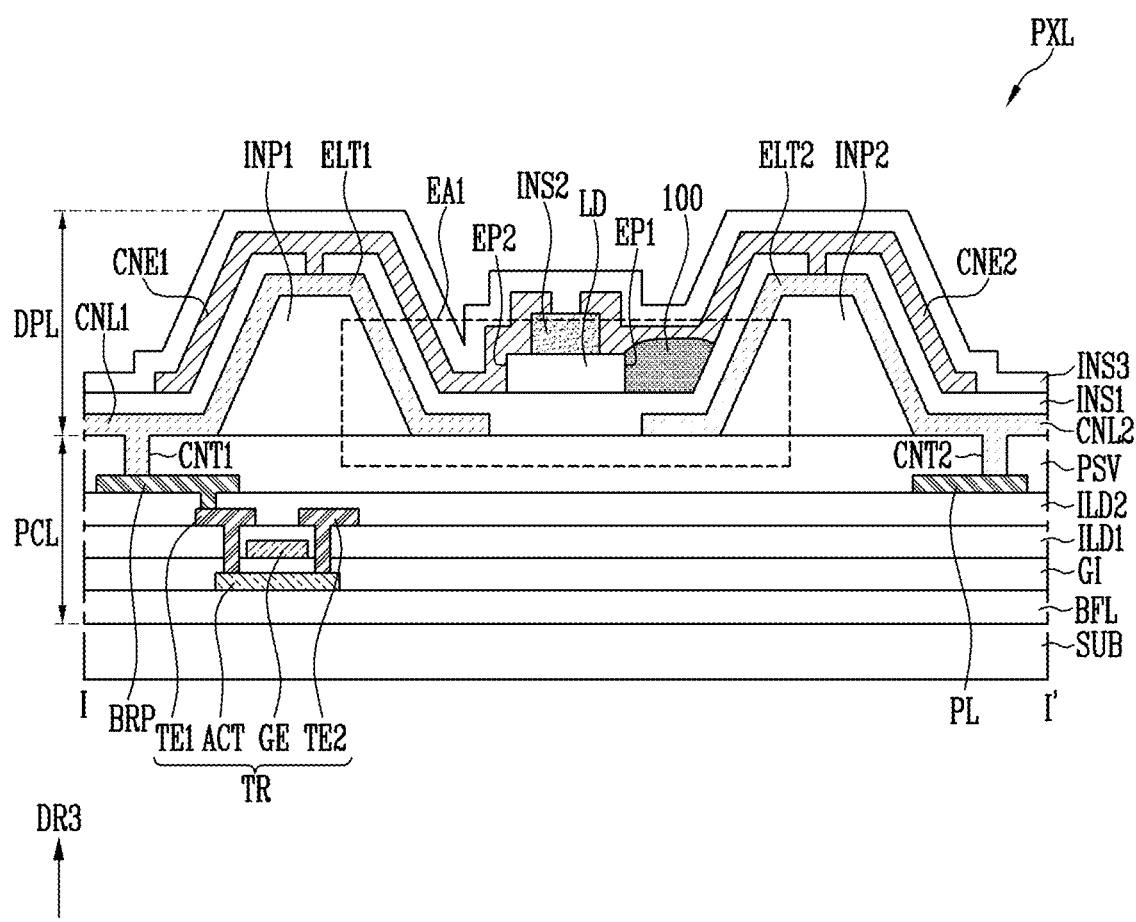
FIG. 5 is a schematic cross-sectional view taken along line I-I' of FIG. 4.

FIG. 5 is a cross-sectional view taken along line I-I' of FIG. 4.

Referring to FIG. 5, the pixel PXL may include the substrate SUB, the pixel circuit part PCL, and a display element part DPL.

The substrate SUB may be provided as a base surface, and the pixel circuit part PCL and the display element part DPL may be disposed on the substrate SUB.

The pixel circuit part PCL may be disposed on the substrate SUB. The pixel circuit part PCL may include a buffer layer BFL, a transistor TR, a gate insulating layer GI, a first interlayer insulating layer ILD1, a second interlayer insulating layer ILD2, a bridge pattern BRP, a power line PL, a passivation layer PSV, a first contact hole CNT1, and a second contact hole CNT2.

The buffer layer BFL may be disposed on the substrate SUB. The buffer layer BFL may prevent diffusion of impurities from the outside. The buffer layer BFL may include at least one selected from the group of silicon nitride ($SiN_x$), silicon oxide ($SiO_x$), silicon oxynitride ($SiO_xN_y$), and metal oxide such as aluminum oxide ($AlO_x$).

The transistor TR may be a thin film transistor. In an embodiment, the transistor TR may be a driving transistor. The transistor TR may drive the light emitting element LD.

The transistor TR may be electrically connected to the light emitting element LD. The transistor TR may be electrically connected to the bridge pattern BRP. However, the embodiments are not limited thereto, and the transistor TR may have various connecting structures. For example, the transistor TR may be directly connected to the first connection line CNL1 rather than being connected thereto through the bridge pattern BRP.

The transistor TR may include an active layer ACT, a first transistor electrode TE1, a second transistor electrode TE2, and a gate electrode GE.

The active layer ACT may include a semiconductor layer. The active layer ACT may be disposed on the buffer layer BFL. The active layer ACT may include at least one selected from the group of polysilicon, amorphous silicon, and an oxide semiconductor.

The active layer ACT may include a first contact area which contacts the first transistor electrode TE1, and a second contact area which contacts the second transistor electrode TE2. The first contact area and the second contact area may be semiconductor patterns doped with impurities. An area between the first contact area and the second contact area may be a channel area. The channel area of the active layer ACT may be an intrinsic semiconductor pattern which is not doped with impurities.

The gate electrode GE may be disposed on the gate insulating layer GI. The position of the gate electrode GE may correspond to the position of the channel area of the active layer ACT. For example, the gate electrode GE may overlap the channel area of the active layer ACT in a plan view. For example, the gate electrode GE may be disposed on the channel area of the active layer ACT with the gate insulating layer GI interposed therebetween.

The gate insulating layer GI may be disposed on the active layer ACT. The gate insulating layer GI may include inorganic material. For example, the gate insulating layer GI may include at least one of silicon nitride ($SiN_x$), silicon oxide ($SiO_x$), silicon oxynitride ($SiO_xN_y$), and aluminum oxide ($AlO_x$).

The first interlayer insulating layer ILD1 may be disposed on the gate insulating layer GI and cover the gate electrode GE. The first interlayer insulating layer ILD1 may include at least one selected from the group of silicon nitride ($SiN_x$), silicon oxide ($SiO_x$), silicon oxynitride ($SiO_xN_y$), and aluminum oxide ($AlO_x$), in the same manner as that of the gate insulating layer GI.

The first transistor electrode TE1 and the second transistor electrode TE2 may be disposed on the first interlayer insulating layer ILD1. The first transistor electrode TE1 may contact the first contact area of the active layer ACT through a contact hole passing through the gate insulating layer GI and the first interlayer insulating layer ILD1. The second transistor electrode TE2 may contact the second contact area of the active layer ACT through another contact hole passing through the gate insulating layer GI and the first interlayer insulating layer ILD1. For example, the first transistor electrode TE1 may be a drain electrode, and the second transistor electrode TE2 may be a source electrode. However, the embodiments are not limited thereto.

The second interlayer insulating layer ILD2 may be disposed on the first transistor electrode TE1 and the second transistor electrode TE2. The second interlayer insulating layer ILD2, the first interlayer insulating layer ILD1, and the gate insulating layer GI may include a same inorganic material. The inorganic material may include at least one of materials such as silicon nitride ($SiN_x$), silicon oxide ($SiO_x$), silicon oxynitride ($SiO_xN_y$), and aluminum oxide ($AlO_x$).

The bridge pattern BRP may be disposed on the second interlayer insulating layer ILD2. The bridge pattern BRP may be electrically connected to the first transistor electrode TE1 through a contact hole passing through the second interlayer insulating layer ILD2. The bridge pattern BRP may be electrically connected to the first connection line CNL1 through the first contact hole CNT1 passing through the passivation layer PSV.

However, the disclosure is not limited to the embodiment, and various embodiments may be implemented. For example, an embodiment in which the bridge pattern BRP is not included may be provided. In this case, the first transistor electrode TE1 may be connected to the first connection electrode CNL1 without passing through the bridge pattern BRP.

The power line PL may be disposed on the second interlayer insulating layer ILD2. The power line PL may be electrically connected to the second connection line CNL2 through the second contact hole CNT2 formed in the passivation layer PSV.

The passivation layer PSV may be disposed on the second interlayer insulating layer ILD2. The passivation layer PSV may cover the bridge pattern BRP and the power line PL. The passivation layer PSV may be provided in the form of an organic insulating layer, an inorganic insulating layer, or a structure including an organic insulating layer disposed on the inorganic insulating layer, but the disclosure is not limited thereto.

In an embodiment, the first contact hole CNT1 connected to an area of the bridge pattern BRP and the second contact hole CNT2 connected to an area of the power line PL may be formed in the passivation layer PSV.

The display element part DPL may be disposed on the pixel circuit part PCL. The display element part DPL may include a first insulating pattern INP1, a second insulating pattern INP2, the first connection line CNL1, the second connection line CNL2, the first electrode ELT1, the second electrode ELT2, a first insulating layer INS1, the light emitting element LD, the liquid metal part 100, a second insulating layer INS2, the first contact electrode CNE1, the second contact electrode CNE2, and a third insulating layer INS3.

The first insulating pattern INP1 and the second insulating pattern INP2 may be disposed on the passivation layer PSV. The first insulating pattern INP1 and the second insulating pattern INP2 may have a shape protruding in the display direction (e.g., in the third direction DR3) of the display device DD. In an embodiment, the first insulating pattern INP1 and the second insulating pattern INP2 may include organic material or inorganic material, but the disclosure is not limited thereto.

The first connection line CNL1 and the second connection line CNL2 may be disposed on the passivation layer PSV. The first connection line CNL1 may be connected to the first electrode ELT1. The first connection line CNL1 may be electrically connected to the bridge pattern BRP through the first contact hole CNT1. The first connection line CNL1 may electrically connect the bridge pattern BRP to the first electrode ELT1. The second connection line CNL2 may be connected to the second electrode ELT2. The second connection line CNL2 may be electrically connected to the power line PL through the second contact hole CNT2. The second connection line CNL2 may electrically connect the power line PL with the second electrode ELT2.

The first electrode ELT1 and the second electrode ELT2 may be disposed on the passivation layer PSV. In an embodiment, at least a portion of the first electrode ELT1 may be disposed on the first insulating pattern INP1, and at least a portion of the second electrode ELT2 may be disposed on the second insulating pattern INP2, so that each may function as a reflective partition wall (or reflective bank). For example, the portion of the first electrode ELT1 disposed on the first insulating pattern INP1 and the portion of the second electrode ELT2 disposed on the second insulating pattern INP2 may reflect lights emitted from the light emitting element LD toward the third direction DR3, and thus, luminance of the display device DD in the third direction DR3 may be improved.

The first electrode ELT1 may be electrically connected to the light emitting element LD through the first contact electrode CNE1. The first electrode ELT1 may be electrically connected to the first contact electrode CNE1 through a contact hole passing through the first insulating layer INS1. The first electrode ELT1 may apply an anode signal to the light emitting element LD.

The second electrode ELT2 may be electrically connected to the light emitting element LD through the second contact electrode CNE2 and the liquid metal part 100. The second electrode ELT2 may be electrically connected to the second contact electrode CNE2 through a contact hole passing through the first insulating layer INS1. The second electrode ELT2 may apply a cathode signal (e.g., a ground signal) to the light emitting element LD.

The first electrode ELT1 and the second electrode ELT2 may include conductive material. For example, the first electrode EL1 and the second electrode EL2 each may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. However, the embodiments are not limited thereto, and the first electrode EL1 and the second electrode EL2 may include various conductive materials.

The first insulating layer INS1 may be disposed on the passivation layer PSV. The first insulating layer INS1 may cover the first electrode ELT1 and the second electrode ELT2. The first insulating layer INS1 may stabilize electrical connection between electrode components ELT1, ELT2, CNL1, and CNL2, and protect the electrode components from external impacts or impurities. The first insulating layer INS1 may include at least one of silicon nitride ($SiN_x$), silicon oxide ($SiO_x$), silicon oxynitride ($SiO_xN_y$), and aluminum oxide ($AlO_x$).

The light emitting element LD may be disposed on the first insulating layer INS1, and emit light based on electrical signals provided from the first contact electrode CNE1 and the second contact electrode CNE2.

As described with reference to FIGS. 1 and 2, the light emitting element LD may include the first end EP1 and the second end EP2.

In an embodiment, the first end EP1 of the light emitting element LD may face the second electrode ELT2, the second contact electrode CNE2, and the liquid metal part 100. The second end EP2 of the light emitting element LD may face the first electrode ELT1 and the first contact electrode CNE1.

Thus, the first semiconductor layer SEC1 of the light emitting element LD may be adjacent to the second electrode ELT2, the second contact electrode CNE2, and the liquid metal part 100. The second semiconductor layer SEC2 of the light emitting element LD may be adjacent to the first electrode ELT1 and the first contact electrode CNE1.

The liquid metal part 100 may be disposed adjacent to the first end EP1 of the light emitting element LD. For example, the liquid metal part 100 may be adjacent to the first semiconductor layer SEC1 of the light emitting element LD.

The liquid metal part 100 may be disposed under the second contact electrode CNE2. The liquid metal part 100 may be disposed between the first insulating layer INS1 and the second contact electrode CNE2. For example, the liquid metal part 100 may be disposed in a space formed between the first insulating layer INS1, the second contact electrode CNE2, and the first end EP1 of the light emitting element LD.

In an embodiment, the liquid metal part 100 may electrically connect the light emitting element LD to the second contact electrode CNE2. For example, the light emitting element LD may be supplied with a cathode signal (e.g., a ground signal) through the liquid metal part 100.

In an embodiment, the liquid metal part 100 may have reflexibility. The liquid metal part 100 may reflect light emitted from the light emitting element LD toward the second end EP2 and/or in the display direction (e.g., the third direction DR3) of the display device DD. Thus, emission efficiency of the light emitting element LD may be greatly improved.

The second insulating layer INS2 may be disposed on the light emitting element LD. The second insulating layer INS2 may cover the active layer AL of the light emitting element LD. In an embodiment, the second insulating layer INS2 may include at least one of organic material and inorganic material. In an embodiment, the second insulating layer INS2 may have a predetermined height, so that the second end EP2 of the light emitting element LD may be separated from the liquid metal part 100.

In an embodiment, the second insulating layer INS2 may be disposed between the first contact electrode CNE1 and the liquid metal part 100 in a plan view.

The first contact electrode CNE1 and the second contact electrode CNE2 may be disposed on the first insulating layer INS1. The first contact electrode CNE1 may electrically connect the first electrode ELT1 to the light emitting element LD. For example, the first contact electrode CNE1 may electrically connect the first electrode ELT1 to the second end EP2 of the light emitting element LD. The second contact electrode CNE2 may electrically connect the second electrode ELT2 to the light emitting element LD. The second contact electrode CNE2 may be electrically connected to the light emitting element LD through the liquid metal part 100. For example, the second contact electrode CNE2 may electrically connect the second electrode ELT2 to the first end EP1 of the light emitting element LD through the liquid metal part 100.

In an embodiment, the first contact electrode CNE1 may apply an anode signal to the light emitting element LD, and the second contact electrode CNE2 may apply a cathode signal to the light emitting element LD.

Each of the first contact electrode CNE1 and the second contact electrode CNE2 may include conductive material. For example, each of the first contact electrode CNE1 and the second contact electrode CNE2 may include at least one transparent conductive material including indium tin oxide (ITO), indium zinc oxide (IZO), and indium tin zinc oxide (ITZO). However, the embodiments are not limited thereto, and the first contact electrode CNE1 and the second contact electrode CNE2 may include various conductive materials.

The third insulating layer INS3 may be disposed on the first contact electrode CNE1, the second contact electrode CNE2, and the second insulating layer INS2. The third insulating layer INS3 may protect elements of the display element part DPL from impacts or impurities. For example, the third insulating layer INS3 may include at least one of silicon nitride ($SiN_x$), silicon oxide ($SiO_x$), silicon oxynitride ($SiO_xN_y$), and aluminum oxide ($AlO_x$). In an embodiment, the third insulating layer INS3 may be omitted.

The structure of the pixel PXL is not limited to the example described with reference to FIG. 5, and various embodiments which may be changed in structure may be implemented. For example, the pixel PXL may further include a planarization layer (e.g., an organic layer) for mitigating a step difference (or height difference) between the individual components. A color conversion layer including quantum dots provided to change the wavelength of light may be disposed on the display element part DPL.

Hereinafter, a structure of the liquid metal part 100 included in the pixel PXL in accordance with an embodiment is provided below in more detail with reference to FIGS. 6 and 7.

Figure 6:
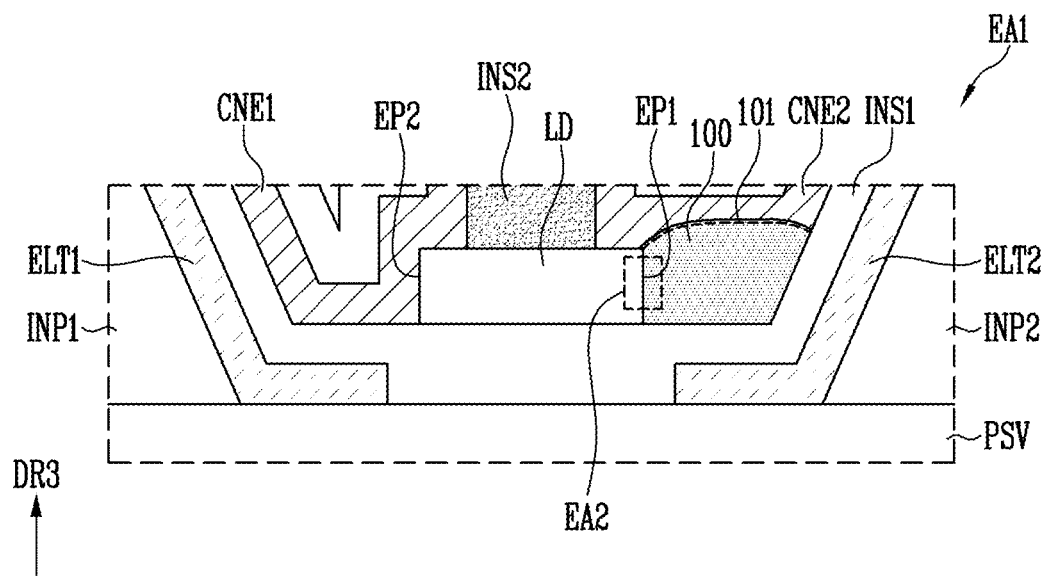
FIG. 6 is a schematic enlarged cross-sectional view of area EA1 of FIG. 5.
Figure 7:
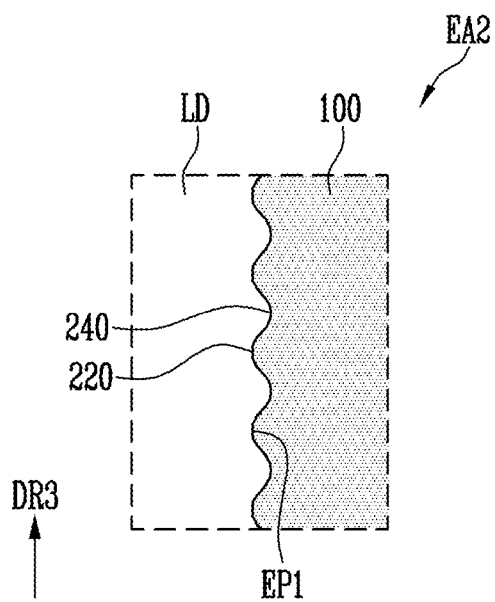
FIG. 7 is a schematic enlarged cross-sectional view of area EA2 of FIG. 6.

FIGS. 6 and 7 are cross-sectional views mainly illustrating the liquid metal part 100. FIG. 6 is an enlarged cross-sectional view of area EA1 of FIG. 5. FIG. 7 is an enlarged cross-sectional view of area EA2 of FIG. 6.

Referring to FIGS. 6 and 7, the light emitting element LD may include an uneven surface. The liquid metal part 100 may have an uneven surface on the first end EP1. The first end EP1 of the light emitting element LD that contacts the liquid metal part 100 may have an uneven surface.

In an embodiment, the liquid metal part 100 may be stretchable (or flexible) so that the liquid metal part 100 may directly contact the uneven surface of the light emitting element LD.

The light emitting element LD may include a concave portion 220 and a convex portion 240 on the first end EP1. For example, multiple concave portions 220 and multiple convex portions 240 may be alternately arranged on the uneven surface of the first end EP1 of the light emitting element. The concave portion 220 and the convex portion 240 may be disposed on the first end EP1. The concave portion 220 may refer to a relatively recessed area, compared to the convex portion 240. The convex portion 240 may refer to a relatively protruded area, compared to the concave portion 220.

In an embodiment, the concave portion 220 of the light emitting element LD may contact the liquid metal part 100. The convex portion 240 of the light emitting element LD may contact the liquid metal part 100.

The liquid metal part 100 may contact the light emitting element LD. For example, in case that at least a portion of the light emitting element LD has an uneven surface, the light emitting element LD may have excellent electrical contact characteristics.

Experimentally, in case that an electrode for electrically connecting the light emitting element LD is formed, the light emitting element LD may not satisfactorily (or operatively) contact the formed electrode because of the uneven surface of the light emitting element LD.

For example, the light emitting element LD may be provided by stacking semiconductor layers on a substrate, patterning the stacked semiconductor layers, and then separating the patterned semiconductor layers from the substrate. Here, a surface of the light emitting element LD may be partially damaged during a process of separating the light emitting element LD from the substrate. Consequently, the surface of the light emitting element LD may have an uneven surface.

Particularly, as the process of fabricating the light emitting element LD is performed, there is a risk that the insulating film INF covers a portion of the first semiconductor layer SEC1 adjacent to the first end EP1. In this case, the surface area of the first semiconductor layer SEC1 to be supplied with an electrical signal may be reduced, so that the electrical contact characteristics between the light emitting element LD and other lines may be reduced.

However, in an embodiment, the liquid metal part 100 having fluidic behavior characteristics (or fluidity) may contact the first end EP1 of the light emitting element LD, so that a contact surface area between the light emitting element LD and the liquid metal part 100 may be increased. Hence, an electrical contact failure between the light emitting element LD and other lines may be prevented. As a result, the display device DD having improved electrical signal reliability may be provided.

Hereinafter, a structure of the pixel PXL in accordance with another embodiment is provided below with reference to FIG. 8. Repetitive descriptions will be simplified or omitted.

Figure 8:
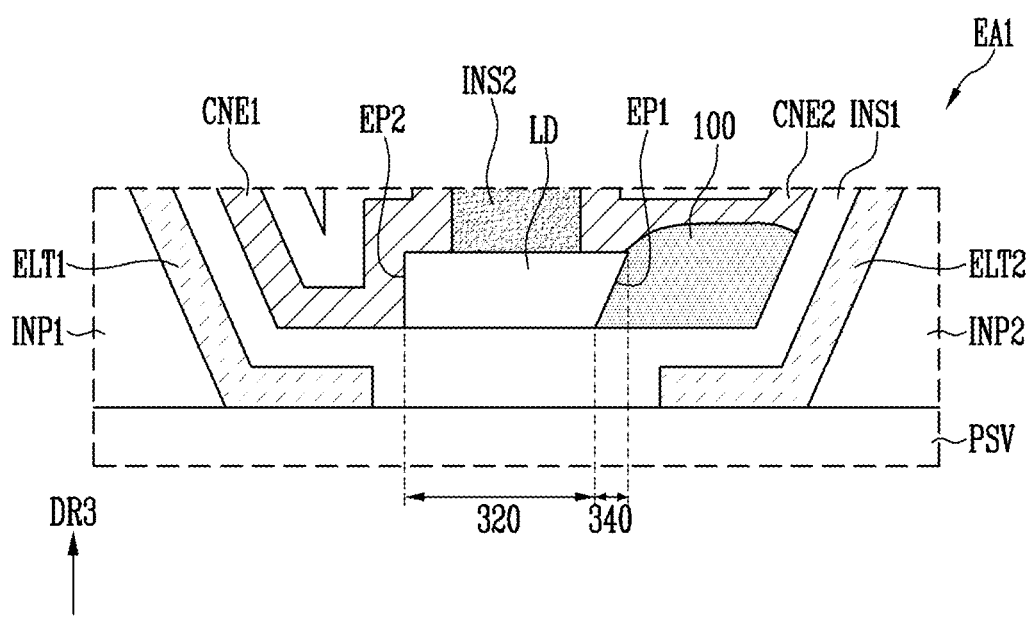
FIG. 8 is a cross-sectional view illustrating a structure of a pixel in accordance with an embodiment, which corresponds to area EA1 of FIG. 5, and FIGS. 9 to 14 are schematic cross-sectional views illustrating processes of a method of manufacturing a display device in accordance with an embodiment.

FIG. 8 is a cross-sectional view illustrating a structure of the pixel PXL in accordance with an embodiment, and is a cross-sectional view illustrating an area corresponding to area EA1 of FIG. 5.

Referring to FIG. 8, the pixel PXL in accordance with the embodiment is different from the pixel PXL (refer to FIG. 6) in accordance with the previous embodiment at least in that a cross-section of the first end EP1 of the light emitting element LD has an inclined shape.

In the embodiment, the light emitting element LD may have an inclined surface. For example, the light emitting element LD may include an inclined surface on the first end EP1. A surface area of a surface of the light emitting element LD that is adjacent to the second insulating layer INS2 may be greater than a surface area of another surface of the light emitting element LD that is adjacent to the first insulating layer INS1. For example, a width of an upper portion of the light emitting element LD which is adjacent to the second insulating layer INS2, may be greater than that of a lower portion of the light emitting element LD which is adjacent to the first insulating layer INS1.

The light emitting element LD may include an uninclined area 320 and an inclined area 340. The light emitting element LD may contact (e.g. directly contact) the first insulating layer INS1 in the uninclined area 320. At least a portion of the light emitting element LD may not contact the first insulating layer INS1 in the inclined area 340. For example, a lower portion of the light emitting element LD in the uninclined area 320 may contact the first insulating layer INS1, and the portion of the light emitting element LD in the inclined area 340 may be spaced apart from the first insulating layer INS1.

In an embodiment, the uninclined area 320 may overlap the active layer AL, the second semiconductor layer SEC2, and a portion of the first semiconductor layer SEC1, in a plan view. The inclined area 340 may overlap a portion of the first semiconductor layer SEC1, in the plan view. In an embodiment, the inclined area 340 may not overlap the second semiconductor layer SEC2 and the active layer AL in a plan view.

A distance between the uninclined area 320 and the second end EP2 may be smaller than a distance between the uninclined area 320 and the first end EP1. A distance between the inclined area 340 and the first end EP1 may be smaller than a distance between the inclined area 340 and the second end EP2. The uninclined area 320 may be adjacent to the first contact electrode CNE1. The inclined area 340 may be adjacent to the second contact electrode CNE2.

The light emitting element LD may be electrically connected to the first contact electrode CNE1 in the inclined area 340, and may not contact the liquid metal part 100. The light emitting element LD may be electrically connected to the second contact electrode CNE2 in the inclined area 340, and contact the liquid metal part 100. For example, the second end EP2 of the light emitting element LD may the first contact electrode CNE1 at an edge of the uninclined area 320, and the first end EP1 of the light emitting element LD may contact the liquid metal part throughout the inclined area 340.

A surface of the light emitting element LD in the inclined area 340 may be nonparallel with the display direction (e.g., the third direction DR3) of the display device DD. The surface of the light emitting element LD in the inclined area 340 may be nonparallel with a thickness-wise direction of the substrate SUB.

At least a portion of the liquid metal part 100 may be disposed under the light emitting element LD in the inclined area 340. At least a portion of the inclined area 340 may overlap the light emitting element LD in the inclined area 340 in a plan view. At least a portion of the liquid metal part 100 may be disposed between the substrate SUB and the light emitting element LD in the inclined area 340. For example, the portion of the liquid metal part 100 may be interposed between the first insulating layer INS1 and the first end EP1 of the light emitting element LD in the inclined area 340.

In the embodiment, the liquid metal part 100 may be provided adjacent to the inclined surface of the first end EP1 of the light emitting element LD. Hence, even in case that the light emitting element LD has an inclined surface, a risk of occurrence of an electrical contact failure may be reduced. It should be noted that the angle between the first end EP1 and the upper surface of the first insulating layer INS1 is not limited to a particular angle. For example, the first end EP1 and the upper surface of the first insulating layer INS1 may form an obtuse angle, a tilted shape, a twisted shape, a curved shape, or the like.

Hereinafter, a method of manufacturing the display device in accordance with an embodiment is provided below with reference to FIGS. 9 to 14. Repetitive descriptions will be simplified or omitted.

FIGS. 9 to 14 are cross-sectional views illustrating, by process steps, the method of manufacturing the display device in accordance with an embodiment. FIGS. 9 to 14 mainly illustrate a cross-sectional structure taken along line I-I' of FIG. 4. For the sake of explanation, repetitive descriptions of the pixel circuit part PCL will be omitted.

Figure 9:
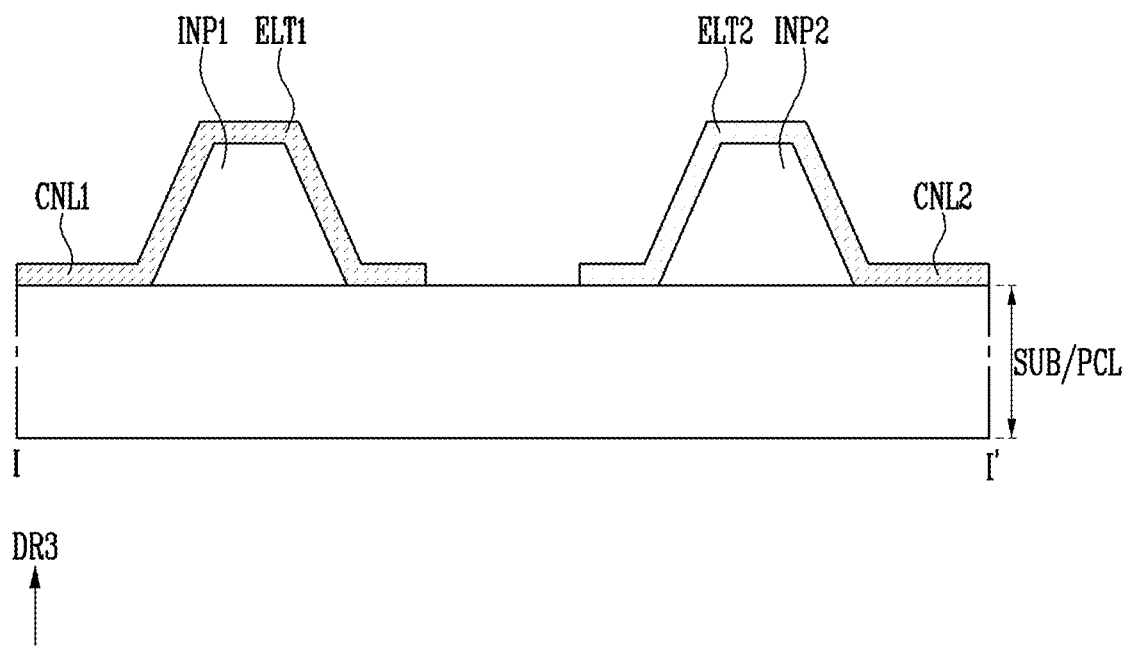

Referring to FIG. 9, the substrate SUB may be provided (or prepared), and the pixel circuit part PCL may be provided (or disposed) on the substrate SUB. Thereafter, the first insulating pattern INP1 and the second insulating pattern INP2 may be formed on the pixel circuit part PCL, and then the first connection line CNL1, the second connection line CNL2, the first electrode ELT1, and the second electrode ELT2 may be formed (or deposited).

At the present step, individual components of the pixel circuit part PCL disposed on the substrate SUB may be formed by patterning a conductive layer (or a metal layer), inorganic material, organic material, etc., through a process using a mask.

At the present step, although not illustrated in the drawings, the first connection line CNL1, the second connection line CNL2, the first electrode ELT1, and the second electrode ELT2 may be provided by depositing a base electrode on the pixel circuit part PCL and then etching at least a portion of the base electrode.

At the present step, the first electrode ELT1 and the second electrode ELT2 may be formed to respectively cover (or overlap) the first insulating pattern INP1 and the second insulating pattern INP2.

Figure 10:
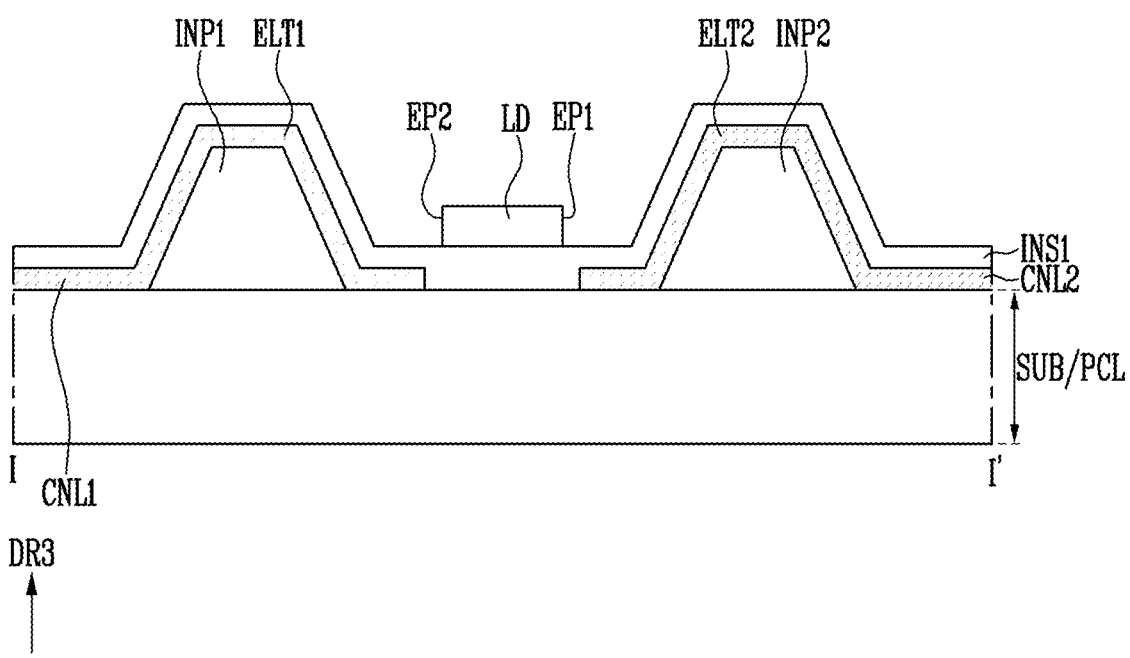

Referring to FIG. 10, the first insulating layer INS1 may be disposed (or formed) on the pixel circuit part PCL, and the light emitting element LD may be disposed on the first insulating layer INS1.

At the present step, the first insulating layer INS1 may be deposited on an overall surface to cover (or overlap) the first connection line CNL1, the second connection line CNL2, the first electrode ELT1, and the second electrode ELT2.

At the present step, the light emitting element LD may be disposed on the first insulating layer INS1, and provided between the first electrode ELT1 and the second electrode ELT2 in a plan view.

Although not illustrated in the drawings, the light emitting element LD may be provided on the first insulating layer INS1 and thereafter arranged by an electric field formed between the first electrode ELT1 and the second electrode ELT2.

In an embodiment, the first end EP1 of the light emitting element LD may face the second electrode ELT2. Here, the light emitting element LD may have an uneven surface on the first end EP1.

Figure 11:
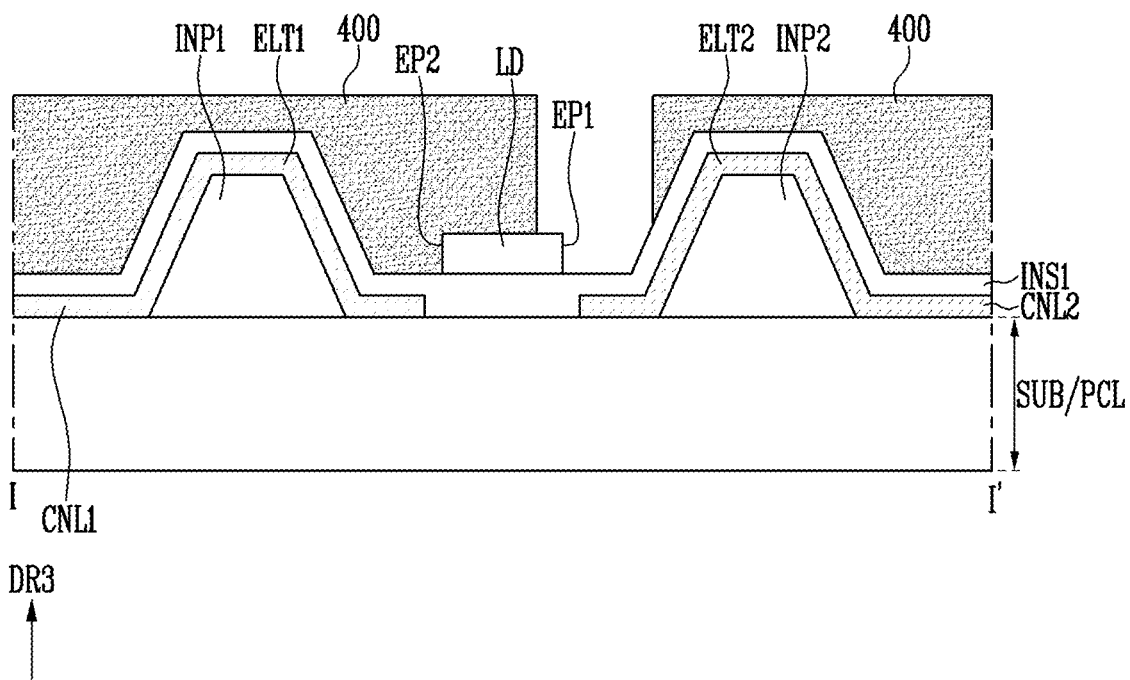

Referring to FIG. 11, a base insulating layer 400 may be formed (or deposited) on the first insulating layer INS1. A process of forming the base insulating layer 400 may be performed before a process of providing the liquid metal part 100.

At the present step, the base insulating layer 400 may be disposed on the first insulating layer INS1 to cover (or overlap) at least a portion of the light emitting element LD. The base insulating layer 400 may overlap the active layer AL of the light emitting element LD in a plan view.

At the present step, the base insulating layer 400 may not be disposed at a position at which the liquid metal part 100 is to be provided during a subsequent process. For example, the base insulating layer 400 may have an opening at which the liquid metal part 100 (refer to FIG. 12) is provided during a subsequent process. For example, the base insulating layer 400 may not be formed in an area in which the liquid metal part 100 is to be disposed.

In an embodiment, the base insulating layer 400 may not overlap at least a portion of the light emitting element LD in a plan view. In a plan view, the base insulating layer 400 may overlap the second end EP2 of the light emitting element LD, and may not overlap the first end EP1 of the light emitting element LD. The base insulating layer 400 may be formed such that the first end EP1 of the light emitting element LD is exposed.

Figure 12:
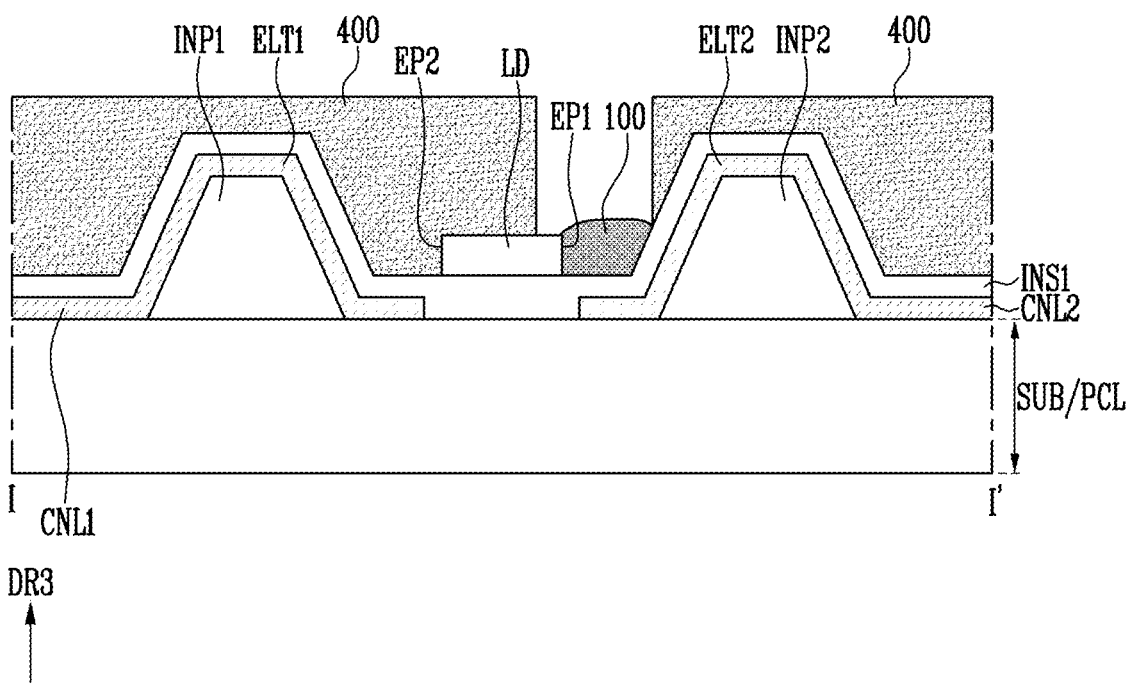

Referring to FIG. 12, the liquid metal part 100 may be provided adjacent to the first end EP1 of the light emitting element LD.

At the present step, the liquid metal part 100 may be electrically connected to the light emitting element LD. The liquid metal part 100 may contact the first end EP1 of the light emitting element LD.

In an embodiment, the liquid metal part 100 may be provided by a printer that includes a nozzle and is configured to discharge liquid metal through the nozzle. The present disclosure is not limited thereto. For example, the liquid metal part 100 may be provided by an electrospinning method.

In an embodiment, the position of the liquid metal part 100 may be controlled by an electric field formed between the first electrode ELT1 and the second electrode ELT2. For example, wetting characteristics of the liquid metal part 100 may be controlled by adjusting the magnitude of the electric field formed between the first electrode ELT1 and the second electrode ELT2. By virtue of the foregoing characteristics, in case that the liquid metal part 100 is provided, the position and/or shape of the liquid metal part 100 may be appropriately controlled.

At the present step, the liquid metal part 100 may be provided in an area in which the base insulating layer 400 is not disposed (or in the opening of the base insulating layer). The liquid metal part 100 may be provided in an area enclosed by the base insulating layer 400 and moved to the first end EP1 of the light emitting element LD. For example, the printer may discharge (or drop) the liquid metal on the base insulating layer 400 having the opening, and the discharged liquid metal may be transported by the electric field formed between the first electrode ELT1 and the second electrode ELT2.

For example, the liquid metal part 100 may have fluid properties. Hence, after being disposed adjacent to the first end EP1 of the light emitting element LD, the liquid metal part 100 may move to contact the first end EP1 of the light emitting element LD. For example, the liquid metal of the liquid metal part 100 may be disposed on the first insulating layer INS1 adjacent to the first end EP1 of the light emitting element LD, and the liquid metal part 100 may be transported toward the first end EP1, and thus, the liquid metal part 100 directly contact the first end EP1 of the light emitting element LD.

In accordance with the disclosure, as described above, even in case that the first end EP1 of the light emitting element LD has an uneven surface, a contact surface area between the first end EP1 and the liquid metal part 100 having the fluid properties may be sufficient to enhance electrical contact characteristics of the light emitting element LD.

Experimentally, in case that the liquid metal part 100 is provided, there is a risk that the first end EP1 of the light emitting element LD and the second end EP2 of the light emitting element LD may be electrically connected to each other due to the fluid properties of the liquid metal part 100.

In an embodiment, before the liquid metal part 100 is provided, the base insulating layer 400 may be provided adjacent to an area in which the liquid metal part 100 is to be provided. Here, the base insulating layer 400 may overlap the light emitting element LD to block flow of the liquid metal part 100.

Particularly, the base insulating layer 400 may expose the first end EP1 of the light emitting element LD through the opening thereof and overlap the second end EP2 of the light emitting element LD, so that a risk that the liquid metal part 100 is provided even on the second end EP2 can be prevented. Thus, the short circuit between the liquid metal part 100 and the second end EP2 may be prevented.

Therefore, a short-circuit defect of the light emitting element LD may be prevented, and a ratio of light emitting elements LD that can be normally operated may be increased, so that the emission efficiency of the light emitting elements LD can be enhanced.

In an embodiment, the step of forming the base insulating layer 400 may be omitted. For example, the liquid metal part 100 may be selectively provided at a position desired to be disposed by printing, so that, as described above, a short-circuit defect of the light emitting element LD can be prevented.

Figure 13:
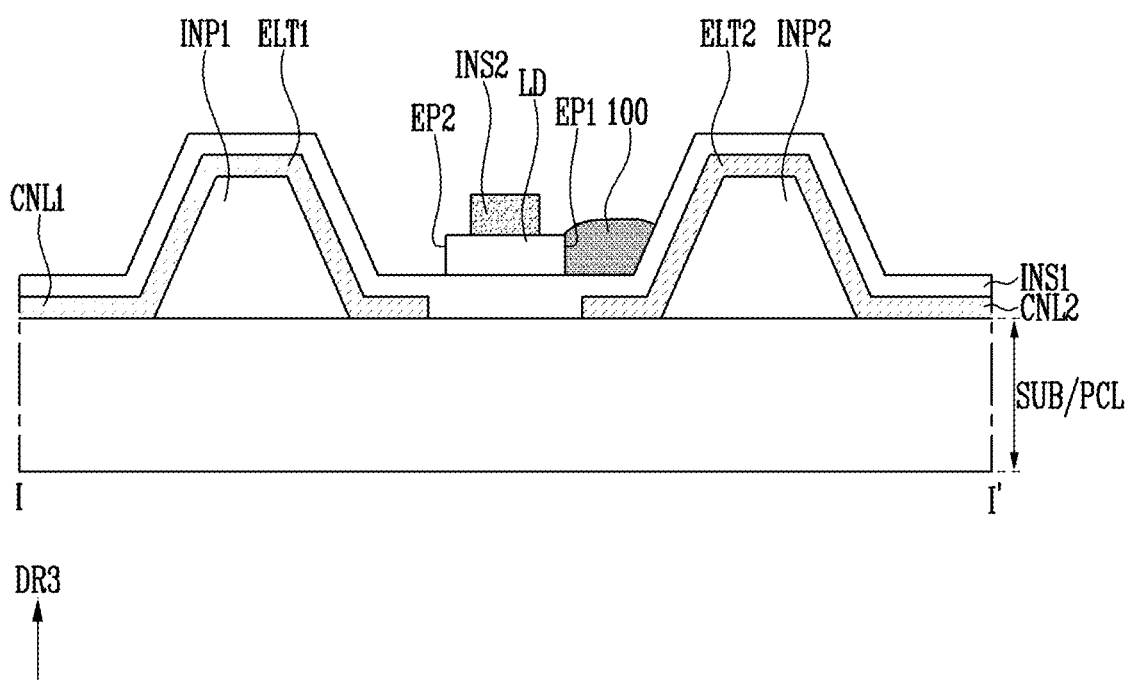

Referring to FIG. 13, the second insulating layer INS2 may be provided by removing (or etching) at least a portion of the base insulating layer 400.

At the present step, the step of removing at least a portion of the base insulating layer 400 may be performed after the liquid metal part 100 is provided.

At the present step, at least a portion of the base insulating layer 400 that overlaps the light emitting element LD may be provided as the second insulating layer INS2 rather than being removed.

Figure 14:
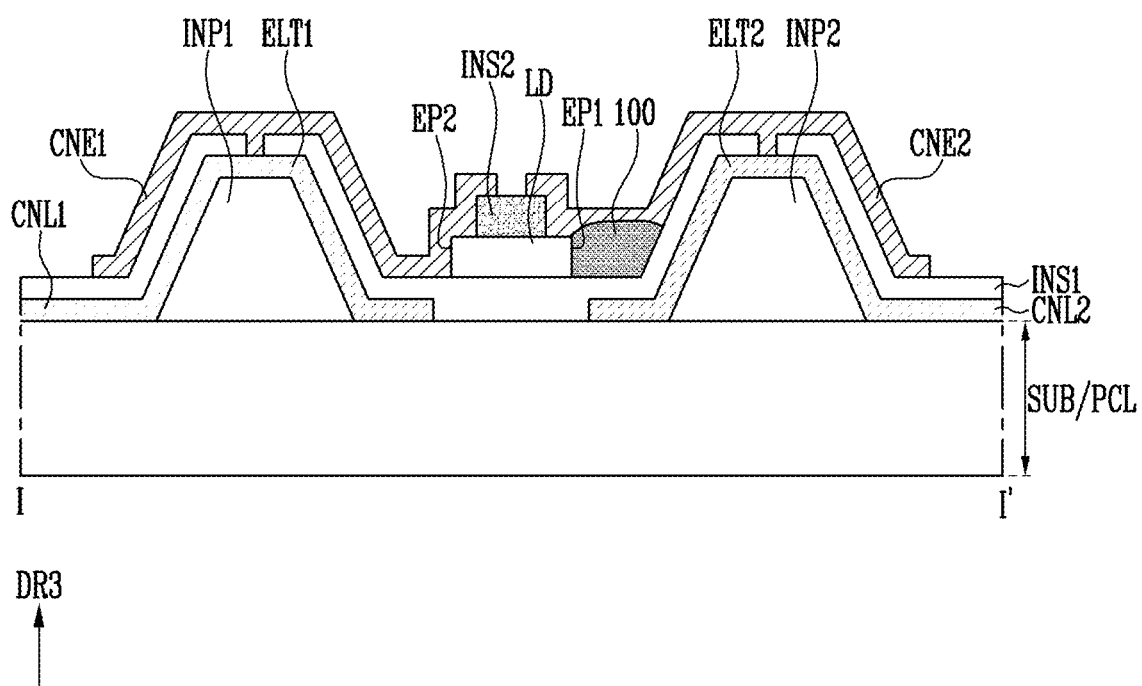

Referring to FIG. 14, contact holes may be formed through the first insulating layer INS1, and the first electrode ELT1 and the second electrode ELT2 may be partially exposed through the contact holes.

The first contact electrode CNE1 and the second contact electrode CNE2 may be formed (or provided) on the first insulating layer INS1 to overlap the second end EP2 and the first end EP1 of the light emitting element LD. For example, the first contact electrode CNE1 may overlap the second end EP2, and the second contact electrode CNE2 may overlap the first end EP1 and the liquid metal part 100.

At the present step, the first contact electrode CNE1 and the second contact electrode CNE2 may be provided by a deposition method. In an embodiment, the first contact electrode CNE1 and the second contact electrode CNE2 may be provided by patterning by an identical process. However, the disclosure is not limited thereto. In an embodiment, after any one of the first contact electrode CNE1 and the second contact electrode CNE2 is formed, the other one of the first contact electrode CNE1 and the second contact electrode CNE2 may be formed.

In an embodiment, the first contact electrode CNE1 and the second contact electrode CNE2 may be electrically connected to the first electrode ELT1 and the second electrode ELT2 through the contact holes of the first insulating layer INS1.

At the present step, the second contact electrode CNE2 may contact the liquid metal part 100. The second contact electrode CNE2 may be electrically connected to the liquid metal part 100.

Thereafter, although not illustrated in the drawings, the third insulating layer INS3 may be formed (or deposited) on the first contact electrode CNE1 and the second contact electrode CNE2. Thus, the display element part DPL in accordance with an embodiment may be provided.

Various embodiments of the disclosure may provide a display device and a method of manufacturing the display device, which may prevent a contact failure of a light emitting element from occurring, so that reliability of an electrical signal may be enhanced, and emission efficiency of the display device may be enhanced.

Effects of the disclosure may not be limited to the above, and other effects of the disclosure will be clearly understandable to those having ordinary skill in the art from the disclosures provided above together with accompanying drawings.

Although embodiments of the disclosure have been described for illustrative purposes, those skilled in the art will appreciate that various modifications, additions and substitutions are possible, without departing from the scope and spirit of the disclosure. Therefore, the above-mentioned embodiments of the disclosure may be may be implemented separately or in combination.

What is claimed is:

1. A display device comprising:
a first insulating layer disposed on a substrate;
a light emitting element disposed on the first insulating layer, the light emitting element including a first end and a second end;
a first contact electrode electrically connected to the second end of the light emitting element;
a second contact electrode electrically connected to the first end of the light emitting element; and
a liquid metal part electrically connecting the first end of the light emitting element to the second contact electrode, wherein
the liquid metal part is different from the second contact electrode,
the liquid metal part is disposed in a concavity of the first insulating layer, and
the liquid metal part directly touches the first end of the light emitting element and is interposed between the first end of the light emitting element and the second contact electrode.

2. The display device according to claim 1, wherein
a portion of the liquid metal part electrically contacts the light emitting element, and
another portion of the liquid metal part electrically contacts the second contact electrode.

3. The display device according to claim 1, wherein an oxide film is formed on a surface of the liquid metal part.

4. The display device according to claim 1, further comprising:
a first electrode and a second electrode disposed on the substrate and spaced apart from each other in a first direction, wherein
the light emitting element is disposed between the first electrode and the second electrode, and
the liquid metal part extends in a second direction intersecting the first direction.

5. The display device according to claim 4, wherein
the light emitting element comprises:
a first light emitting element; and
a second light emitting element adjacent to the first light emitting element in the second direction, and
the liquid metal part electrically contacts each of the first light emitting element and the second light emitting element.

6. The display device according to claim 1, wherein
the light emitting element comprises:
a first semiconductor layer adjacent to the first end of the light emitting element and including an N-type semiconductor layer; and
a second semiconductor layer adjacent to the second end and including a P-type semiconductor layer, and
a distance between the liquid metal part and the first semiconductor layer is smaller than a distance between the liquid metal part and the second semiconductor layer.

7. The display device according to claim 1, wherein the light emitting element has an uneven surface on the first end of the light emitting element.

8. The display device according to claim 1, wherein
the light emitting element comprises:
a concave portion; and
a convex portion, and
the concave portion and the convex portion are disposed in the first end of the light emitting element and electrically contact the liquid metal part.

9. The display device according to claim 1, wherein
the light emitting element comprises an inclined area adjacent to the first end of the light emitting element, and
the light emitting element has a surface nonparallel to a thickness-wise direction of the substrate in the inclined area.

10. The display device according to claim 9, wherein the light emitting element electrically contacts the liquid metal part in the inclined area.

11. The display device according to claim 9, wherein the liquid metal part overlaps the light emitting element in the inclined area in a plan view.

12. The display device according to claim 9, wherein at least a portion of the liquid metal part is disposed under the light emitting element in the inclined area.

13. The display device according to claim 1, wherein the liquid metal part includes an eutectic gallium-indium (EGaIn) alloy or a gallium-indium-tin (Galinstan) alloy.

14. The display device according to claim 6, wherein the light emitting element is supplied with an anode signal through the first contact electrode and supplied with a cathode signal through the second contact electrode and the liquid metal part.

15. The display device according to claim 1, further comprising:
a second insulating layer disposed on the light emitting element and located between the first contact electrode and the liquid metal part in a plan view.

16. The display device according to claim 1, wherein
both the first contact electrode and the liquid metal part are disposed directly on a lowermost surface of the concavity, and
the liquid metal part spaces the second contact electrode apart from the lowermost surface of the concavity.

17. The display device according to claim 16, wherein
the first contact electrode is disposed directly on a first area of a first inclined surface of the concavity,
the second contact electrode is disposed directly on a second area of a second inclined surface of the concavity,
the liquid metal part is disposed directly on a third area of the second inclined surface of the concavity, the second area being smaller than the first area by at least the third area.

18. The display device according to claim 1, wherein
the first and second ends of the light emitting element are lateral distal ends of the light emitting element, and
the first contact electrode directly touches the second end of the light emitting element.

19. The display device according to claim 1, wherein
the first end of the light emitting element comprises one or more inconsistencies such that a surface roughness of the first end of the light emitting element is greater than a surface roughness of the second end of the light emitting element, and
the liquid metal part fills the one or more inconsistencies in the first end of the light emitting element.

20. The display device according to claim 1, further comprising:
- a first electrode disposed on the substrate; and
- a second electrode disposed on the substrate and spaced apart from the first electrode, wherein
- both the first electrode and the second electrode are disposed between the first insulating layer and the substrate, and
- the first insulating layer comprises:
  - a first contact hole through which the first contact electrode is electrically connected to the first electrode; and
  - a second contact hole through which the second contact electrode is electrically connected to the second electrode.

* * * * *